United States Patent [19]

Steckler

[11] 4,081,758

[45] Mar. 28, 1978

[54] LOW DISTORTION SIGNAL AMPLIFIER ARRANGEMENT

[75] Inventor: Steven Alan Steckler, Clark, N.J.

[73] Assignee: RCA Corporation, New York, N.Y.

[21] Appl. No.: 690,721

[22] Filed: May 27, 1976

[51] Int. Cl.² .............................................. H03F 3/45
[52] U.S. Cl. .................................... 330/252; 330/261; 330/69
[58] Field of Search .............................. 330/30 D, 69

[56] References Cited

U.S. PATENT DOCUMENTS

| | | | |
|---|---|---|---|
| 3,641,450 | 2/1972 | Lunn | 330/30 D |
| 3,848,139 | 11/1974 | Holt, Jr. | 330/30 D X |
| 3,916,333 | 10/1975 | Zuk | 330/30 D |

*Primary Examiner*—Lawrence J. Dahl
*Attorney, Agent, or Firm*—Eugene M. Whitacre; William H. Meagher; Kenneth R. Schaefer

[57] ABSTRACT

A signal amplifier arrangement comprises first and second differential amplifiers coupled in common to a current source which supplies all of the current to the amplifier circuits. Signals to be amplified are coupled between the control electrodes (bases) of the devices in each of the differential circuits by means of voltage follower stages. The main conduction path (collector-emitter) of each of the followers is coupled in series with the main conduction path of the device in the first differential circuit other than the one to the control electrode of which the follower output is coupled. Output signal current is produced in one or more load circuits connected to the second differential circuit, the output signal current being related to the differential input signal voltage but substantially independent of current level induced base-emitter voltage variations in the differential amplifier devices.

6 Claims, 1 Drawing Figure

U.S. Patent
March 28, 1978
4,081,758
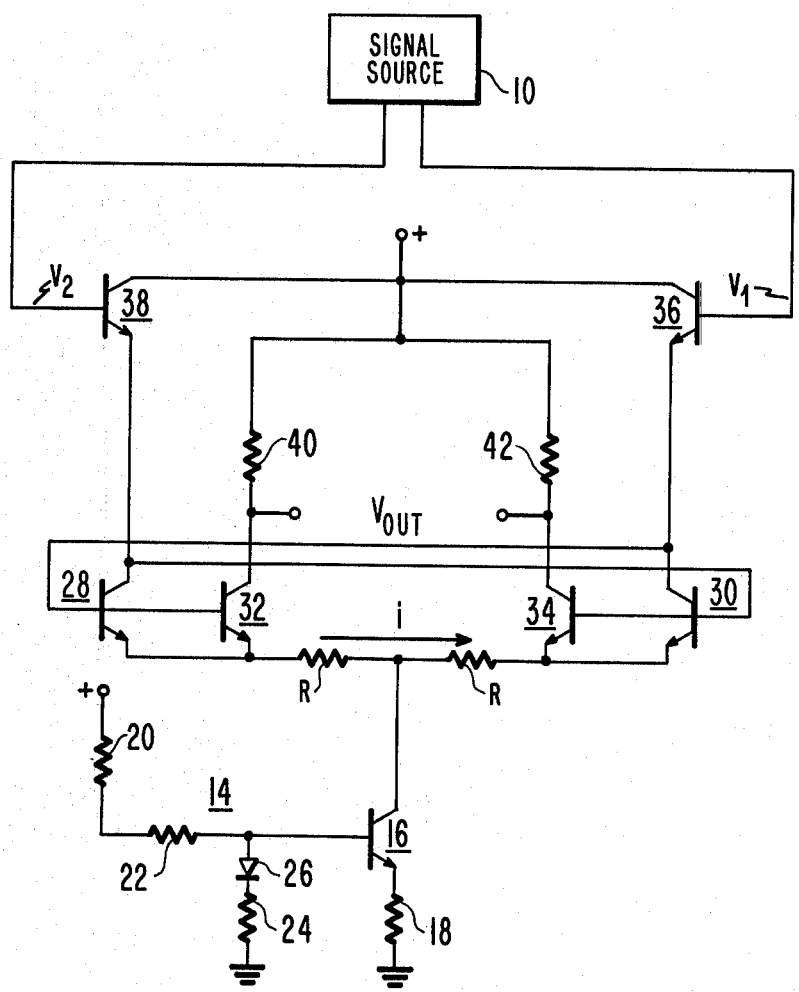

LOW DISTORTION SIGNAL AMPLIFIER ARRANGEMENT

This invention relates to semiconductor differential signal processing circuits and, more particularly, to arrangements for cancelling the effect of distortion-producing, non-linear base-emitter voltage characteristics in such differential circuits.

Transistor differential amplifier arrangements including three (or more) active devices are commonly employed in monolithic integrated circuits as well as discrete device circuits. Such differential amplifiers are particularly suitable for construction in integrated circuit form where the characteristics of the differentially coupled transistors are readily matched one to another.

As was pointed out in the publication "RCA Linear Integrated Circuit Fundamentals", Technical Series IC-40, published by RCA Corporation, transistor differential amplifiers exhibit a transfer characteristic including a distortion or offset term dependent upon the base-emitter voltage ($V_{be}$) of the transistors. This offset voltage is, in turn, variably dependent upon several factors including temperature, $\beta$ of the transistors and various base and emitter resistor values and ratios. When low distortion is a requirement, differential amplifiers typically are degenerated with emitter resistors that are large compared to the junction impedances of the devices, or by some other equivalent means such as reducing the direct current bias. Degeneration has the undesired effect of reducing the signal gain of the stage. The present invention permits the use of emitter degenerating resistors but their values may be significantly lower for a given amount of output distortion.

In accordance with the present invention, a signal amplifier arrangement comprises first and second differential amplifiers coupled in common to a direct current source which supplies all of the current to the differential circuits. Signals to be amplified are coupled between the control electrodes (bases) of the devices in each of the differential circuits by means of voltage follower stages. The main conduction path (collector-emitter) of each of the followers is coupled in series with the main conduction path of the device in the first differential circuit other than the one to the control electrode of which the follower output is coupled. Output signal current is produced in at least one load circuit connected to the second differential circuit, the output signal current being related to the differential input signal voltage but substantially independent of current level induced base-emitter voltage variations in the differential amplifier devices.

Referring to the single FIGURE of the drawing, operating bias is supplied to a current source (or sink) transistor 16 by means of a biasing network 14. Specifically, the quiescent operating current of transistor 16 is fixed by the combination of an emitter degeneration resistor 18 and a series circuit including first, second and third resistors 20, 22, 24 and a diode 26 coupled across a source of direct voltage (+). Current source transistor 16 provides operating current to a first or input pair of differentially coupled transistors 28, 30 and to a second or output pair of differentially coupled transistors 32, 34. Signal voltages ($V_1$, $V_2$) are supplied from a signal source 10 to the base (control) electrodes of voltage follower transistors 36 and 38. The emitter (output) of follower transistor 36 is direct coupled to the joined bases of transistors 28 and 32 to apply signal voltage thereto while the emitter of follower transistor 38 is similarly coupled to the joined bases of transistors 30, 34 to apply signal voltage thereto.

In accordance with the present invention, the emitter-collector or main current conduction path of follower transistor 38 is direct current coupled to the emitter-collector or main current conduction path of input differential transistor 28 while the emitter-collector or main current conduction path of follower transistor 36 is direct current coupled to the emitter-collector or main current conduction path of input differential transistor 30.

Output or load circuits illustrated as resistors 40 and 42 are coupled, respectively, to the collectors of output transistors 32 and 34.

The operation of the illustrated configuration will be described by first considering only the three transistors 16, 32, 34 as a simple differential amplifier. In that case, the differential emitter current in the transistors (i.e., the voltages at the emitters of transistors 32 and 34 divided by the sum of the resistors R) may be related to the input signal voltages $V_1$ and $V_2$ in the following manner.

$$V_{e32} = V_1 - (KT/q) \ln (i_{e32}/i_s)$$

and $$V_{e34} = V_2 - (KT/q) \ln (i_{e34}/i_s)$$

where:
$i_s$ = saturation current of each transistor;
$q$ = the charge on an electron;
$K$ = Boltzman's constant; and
$T$ = absolute temperature in degrees Kelvin.
Then, $$V_{e32} - V_{e34} = V_1 - V_2 + KT/q (\ln i_{e34}/i_{e32}).$$

It can therefore be seen that the differential signal current ($V_{e32} - V_{e34}/2R$) will include not only a term dependent upon the applied differential signal voltage ($V_1 - V_2$) but also includes a non-linear distortion term dependent upon emitter current levels.

This effect may be negated by combining with the input signal voltage a compensating voltage which will cancel the distortion term. This compensating voltage is provided in the illustrated configuration in the following manner.

The signal voltages $V_1$ and $V_2$ are applied to the differential transistors 32, 34 via follower transistors 36 and 38, respectively. The base-emitter voltages of follower transistors 36, 38 therefore subtract from the signal voltages $V_1$, $V_2$. In that case, the voltage at the emitters of transistors 28 and 32 may be expressed as follows:

$$V_{e28} = V_1 - V_{be36} - V_{be28} = V_{e32}.$$

Similarly, the voltage at the emitters of transistors 30 and 34 may be expressed as follows:

$$V_{e30} = V_2 - V_{be38} - V_{be30} = V_{e34}.$$

Assuming that the current gain of each of the transistors is sufficiently high so that base current of a device is negligible compared to collector (or emitter current), it can be seen that the collector currents of series connected transistors 28 and 38 are substantially equal and the collector currents of series connected transistors 36 and 30 are substantially equal. Furthermore, if transistors 28 and 38 are of equal geometry, their base-emitter voltages will be substantially equal ($V_{be28} = V_{be38}$). Similarly, with transistors 30 and 36 of equal geometry, their base-emitter voltages will also be substantially equal ($V_{be30} = V_{be36}$).

The differential emitter voltage ($V_{e28} - V_{e30}$) may be expressed as follows:

$$V_{e28} - V_{e30} = V_1 - V_{be36} - V_{be28} - V_2 + V_{be38} + V_{be30}.$$

Substituting for $V_{be36}$ and $V_{be38}$ from above, $$V_{e28} - V_{e30} = V_1 - V_{be30} - V_{be28} - V_2 + V_{be28} + V_{be30}$$

$$V_{e28} - V_{e30} = V_1 - V_2.$$

Thus, the $V_{be}$ terms (which include the undesired, logarithmic, current dependent distortion terms) are cancelled.

A differential signal current ($i$) between the emitters of transistors 28 and 30 therefore may be expressed as follows:

$$i = (V_1 - V_2)/2R$$

Where output transistors 32 and 34 have geometries which are matched to transistors 28 and 30, differential signal currents ($+i$ and $-i$) will be produced in the collectors of transistors 32 and 34. It can be seen from the last expression that such signal currents will be free of non-linear current level development $V_{be}$ distortion producing terms.

What is claimed is:

1. A signal amplifier arrangement comprising:
   a first circuit path for providing a direct operating current;
   a first differential amplifier circuit comprising first and second semiconductor devices, each having a main current conduction path coupled to said first direct current circuit path and each having a control electrode;
   an output differential amplifier circuit comprising third and fourth semiconductor devices, each having a main current conduction path coupled to said first direct current circuit path and each having a control electrode direct current coupled respectively to control electrodes of said first and second devices;
   at least a first output load circuit coupled to a main current conduction path of one of said third and fourth devices at a point remote from said coupling to said first direct current providing circuit path;
   a source of signals to be amplified;
   means comprising fifth and sixth semiconductor devices having main current conduction paths coupled respectively to said main current conduction paths of said second and first devices, having conduction characteristics substantially equal to conduction characteristics of said first and second devices and each having a control electrode coupled to said source of signals for coupling signal voltages between said control electrodes of said first and second devices and between said control electrodes of said third and fourth devices; whereby
   output signal current produced in said load circuit is related to said signals and substantially independent of current level induced variations in characteristics of said devices to which said signal voltages are coupled.

2. An arrangement according to claim 1 wherein:
   said first, second, fifth and sixth devices are like conductivity transistors, said control electrodes are base electrodes and said main conduction paths are between respective collector and emitter electrodes; and
   said fifth and sixth transistors are coupled in emitter follower configuration with respect to said signals to be amplified.

3. An arrangement according to claim 2 wherein:
   said collector-emitter paths of said first and sixth transistors are coupled in series combination and said collector emitter paths of said second and fifth transistors are coupled in series combination.

4. An arrangement according to claim 3 wherein:
   said transistors in each said series combination carry like quiescent currents and thereby have like base-emitter offset voltages.

5. An arrangement according to claim 4 wherein:
   output voltage across said output load circuit is substantially free of base-emitter offset voltage distortion effects.

6. An arrangement according to claim 5 and further comprising:
   a second output load circuit coupled to a main current conduction path of the other of said third and fourth devices, whereby output voltage across said second load circuit is substantially free of base-emitter offset voltage distortion effects.

* * * * *